United States Patent [19]
Sakamoto et al.

[11] Patent Number: 5,148,491
[45] Date of Patent: Sep. 15, 1992

[54] AUTOMATIC MIXER APPARATUS

[75] Inventors: Sinji Sakamoto, Hyogo; Kenichi Furukawa, Osaka, both of Japan

[73] Assignee: Toa Corporation, Japan

[21] Appl. No.: 575,243

[22] Filed: Aug. 30, 1990

[30] Foreign Application Priority Data

Oct. 13, 1989 [JP] Japan .................................. 1-266985
Oct. 13, 1989 [JP] Japan .................................. 1-266986

[51] Int. Cl.$^5$ ......................... H04B 1/00; H04R 3/00; H04R 29/00; H03G 3/00
[52] U.S. Cl. ..................................... 381/119; 381/92; 381/59; 381/107
[58] Field of Search ...................... 381/28, 27, 22, 119, 381/1, 107, 55, 59, 96, 92, 110

[56] References Cited

U.S. PATENT DOCUMENTS 4,296,278 10/1981 Cullison .................................. 381/55
4,489,442 12/1984 Anderson ............................. 381/107
4,503,554 3/1985 Davis .................................... 381/1
4,633,495 12/1986 Schotz .................................. 381/107
4,852,176 7/1989 Truhe .................................... 381/59

Primary Examiner—James L. Dwyer
Assistant Examiner—Jack Chiang
Attorney, Agent, or Firm—Townsend and Townsend

[57] ABSTRACT

An automatic mixer apparatus is described which comprises a plurality of channels each including a level detecting circuit, a comparator and a voltage control amplifier, a gain control circuit for controlling the gains of the voltage control amplifiers of the respective channels and a mixer circuit for mixing signals from the voltage control amplifiers. The level detecting circuit detects a level of an aural signal received at the corresponding channel and the comparator operates to compare the detected level from the detecting circuit and a reference level. When the detected level is higher than the reference level, the comparator outputs a comparison signal to the corresponding voltage control amplifier to turn on. The gain control circuit receives the comparison signals from the whole comparators and outputs a gain control signal to the respective voltage amplifiers whereby the gains thereof are controlled in accordance with the number of the comparison signals received at the gain control circuit.

5 Claims, 4 Drawing Sheets

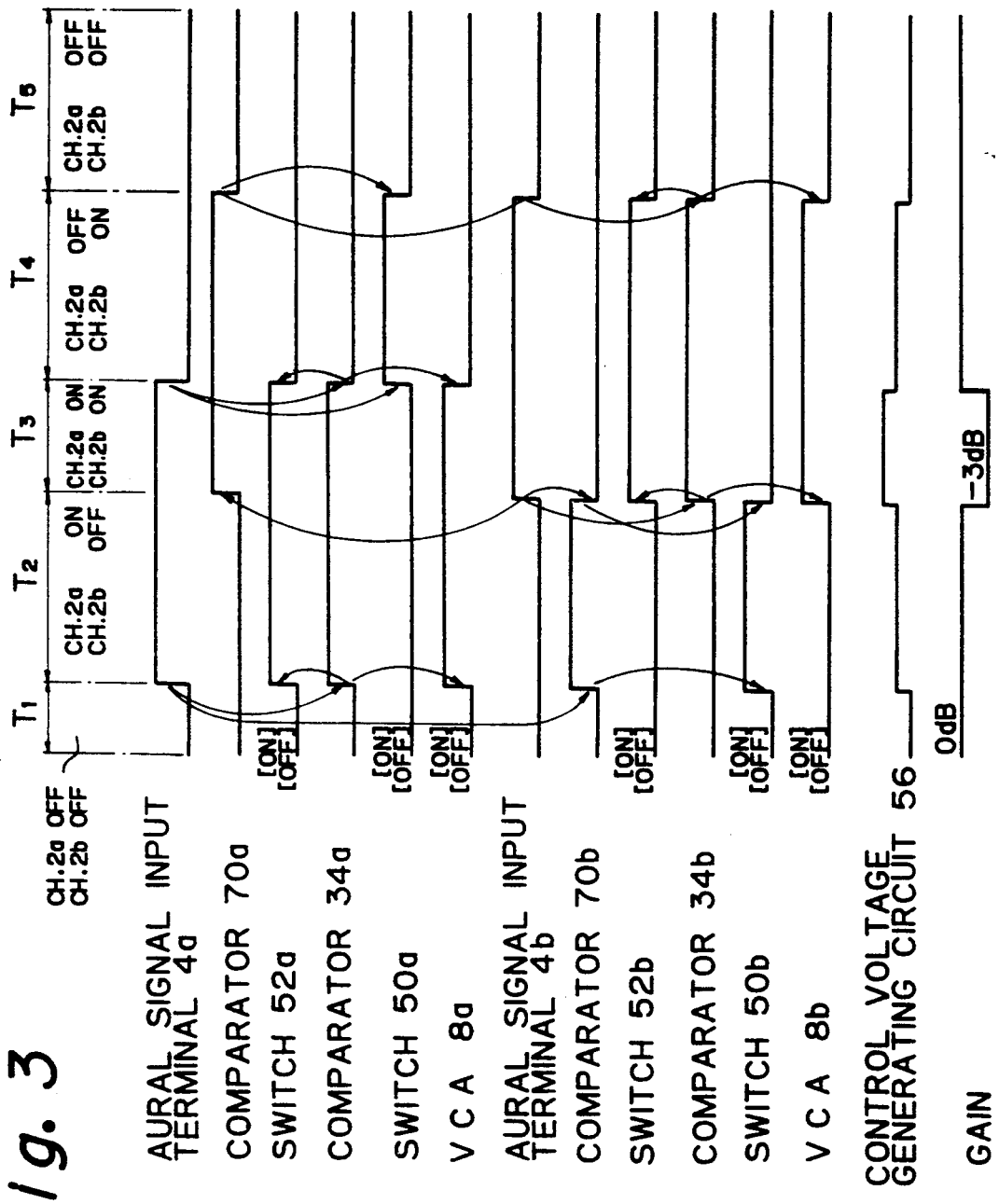

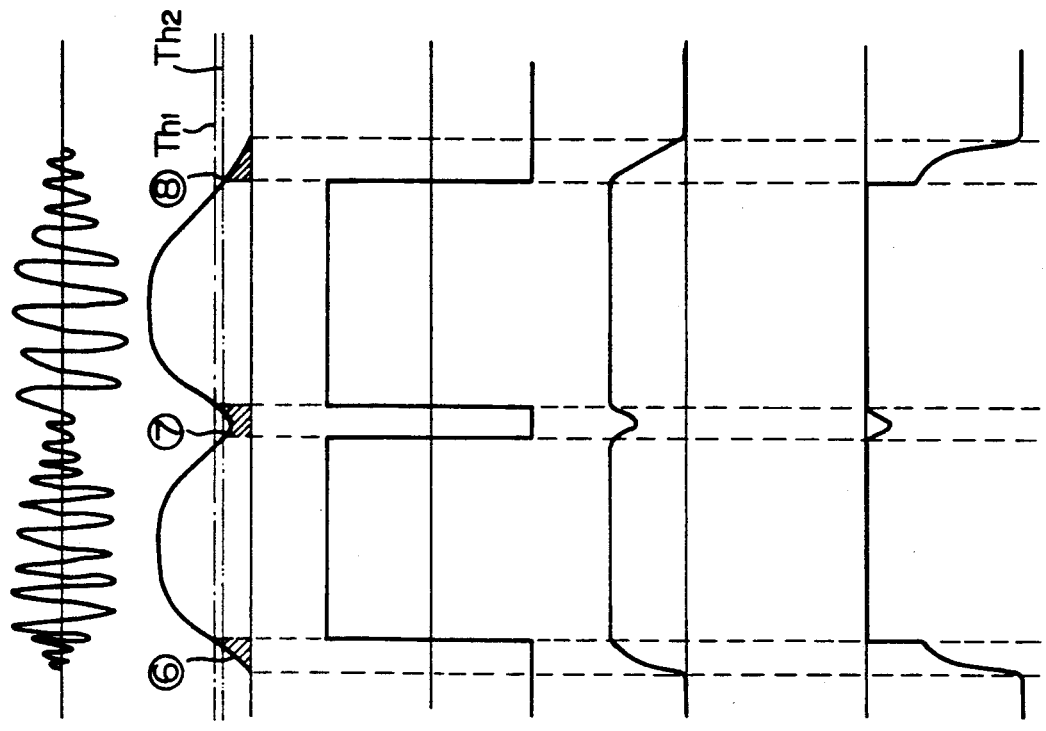

AUTOMATIC MIXER APPARATUS

BACKGROUND OF THE INVENTION

1. Field of the Invention

This invention relates to an automatic mixer apparatus arranged to automatically turn on channels connected between a mixing circuit and aural signal sources generating aural signals and automatically regulate gains of channels in response to the number of aural signals generated.

2. Prior Art

Hitherto known are automatic mixer apparatus of the kind mentioned above, such as one described in U.S. Pat. No. 3,814,856, for example. Such an apparatus is generally arranged so that a plurality of microphones are respectively associated with channels each of which includes a gate circuit for turning on and off an aural signal provided to the channel from the associated microphone, a circuit for detecting the level of the aural signal on the channel and a comparator for comparing the level of the aural signal and a reference level. Also, there are separately provided further detection circuits for detecting the level of background noise signals from microphones for picking up noises and the background noise levels detected by the respective detection circuits are also provided as a reference signal to the comparators in the respective channels. Each of the comparators generates a control signal to the corresponding gate circuit to transfer the aural signal when the level of the aural signal is higher than that of the background noise. The aural signals conducted through the respective channels, or the gate circuits are added and amplified by an amplifier which is provided with a circuit for automatically reducing the gain of the amplifier in response to the number of channels with open gate circuits. Thus, if a person begins to speak through one of the microphones, the level of the aural signal from that microphone will become higher than that of the background noise so that the gate circuit of the channel associated with that microphone is opened to transfer the aural signal to the amplifier. Since only one speaker is speaking at that time, the gain of the amplifier is at a maximum rate. In this condition, if another person begins to speak through another microphone, the gate circuit in the channel associated therewith will be opened to transfer the aural signal of the second person to the amplifier. Thus, the number of gate circuits opened is increased and the amplifier gain will be reduced. The reason why the amplifier gain is controlled to be reduced in response to the increased number of open gate circuits is to enable a maximum voice magnification without any howling. The reason why only the channel gate circuits are opened in association with the microphones generating aural signals is to enhance the S/N ratio by operating only the corresponding channels.

In the prior automatic mixer apparatus mentioned above, since the gate circuit is controlled to be opened only when the level of the aural signal is larger than that of the background noise signal, the gate circuit is closed when the former is lower than the latter even when a person is talking. Accordingly, at the initial, intermediate and terminal portions of a speech, signal levels which may be lower than a noise signal level will be cut off, and thus an unnatural speech will be produced by the prior apparatus.

Further, in the prior apparatus, when a person begins to speak through a microphone, his voice may be picked up by other microphone positioned nearby and thus a plurality of channel gate circuits may simultaneously be opened. In such an event, the number of microphones generating aural signals increases to cause the amplifier gain to be reduced, although only one person is actually speaking, and thus articulation to be lowered. Even when unused microphones do not directly pick up the person's voice, since the voice will be amplified by the amplifier to produce a magnified sound from the speaker, the other microphone or microphones may pick up the magnified sound from the speaker to cause a reduction in amplifier gain and thus a reduction in articulation, as similar to above. Further, the prior art apparatus arranged to compare the level of the aural signal with that of background noise requires additional microphones for detecting background noises and circuits for detecting the level thereof. These make the apparatus complicated.

SUMMARY OF THE INVENTION

It is, therefore, an object of this invention to provide an automatic mixer apparatus which corrects the problems set forth above especially the reduction in articulation of a mixed aural output signal.

This object is achieved by an automatic mixer apparatus which comprises a plurality of channels each including means for detecting a level of an input signal, comparator means comparing the detected level of the input signal with a reference signal level, and gain controllable transfer gate means for selectively transferring the input signal in response to the comparison signal, control means connected to receive the comparison signals from the comparator means of the whole channels for controlling the gains of the transfer gate means of the channels in accordance with the number of received comparison signals, and mixing means for mixing signals from the transfer means of the channels.

A feature of this invention is that each of the channels incorporates the gain controllable transfer gate means which selectively transfers an input signal in response to the signal level and the gain of which is controlled in accordance with the level of the sum of the input signals of the whole channels.

BRIEF DESCRIPTION OF THE DRAWINGS

FIG. 3 is a timing chart for explaining the operation of the embodiment; and

FIGS. 4(a)–4(e) are wave form diagrams for explaining the operation of the sub-controller used in the embodiment.

DETAILED DESCRIPTION OF THE PREFERRED EMBODIMENT

Figure 1:
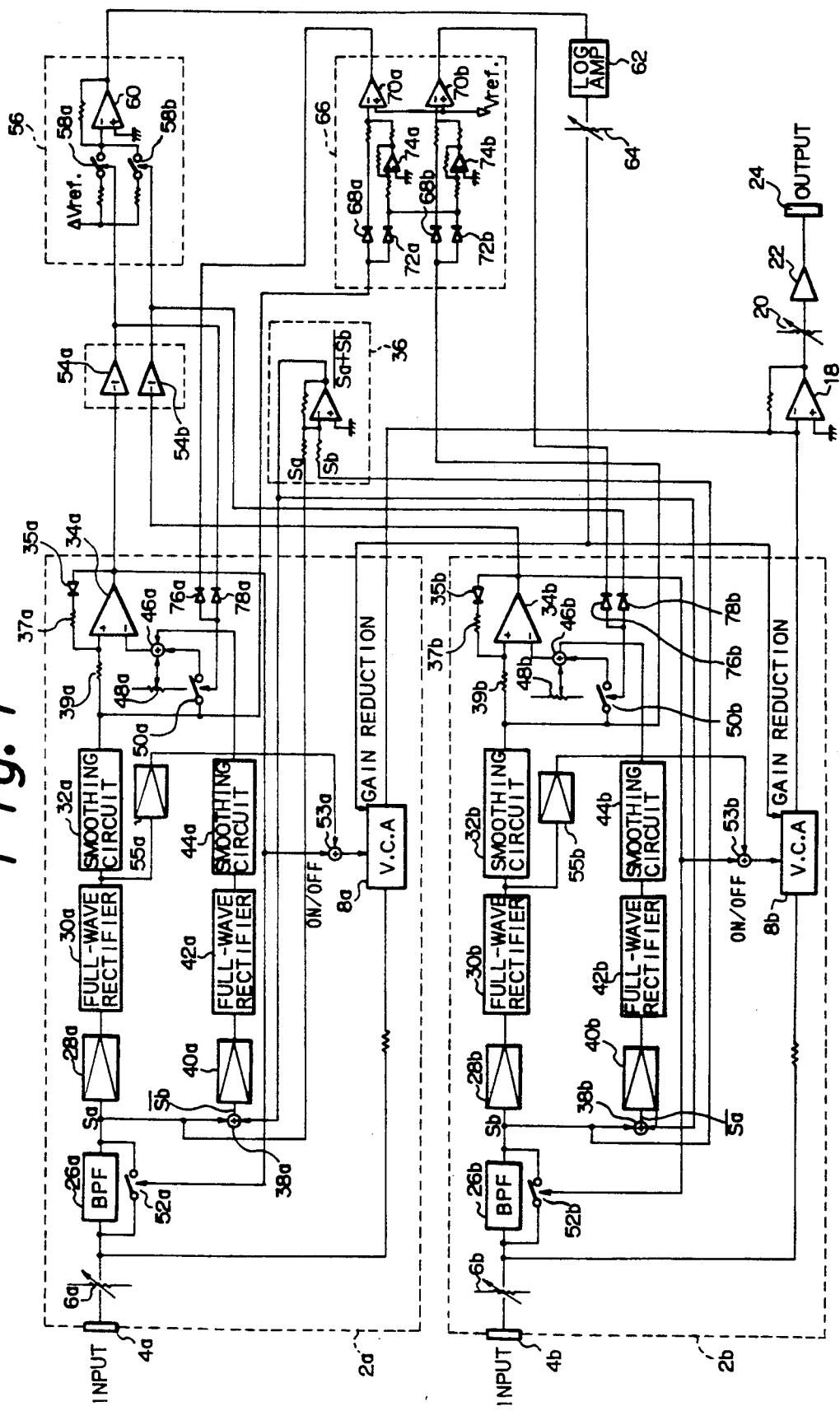
FIG. 1 is a block diagram of an embodiment of the automatic mixer apparatus in accordance with the present invention.

FIG. 1 shows a first embodiment of the present invention in a block diagram including two channels 2a and 2b. These channels 2a and 2b have identical arrangements and identical parts are denoted by the same reference numerals with suffixes "a" and "b" for the channels 2a and 2b, respectively. A description only with reference to channel 2a will be given below.

Figure 2:
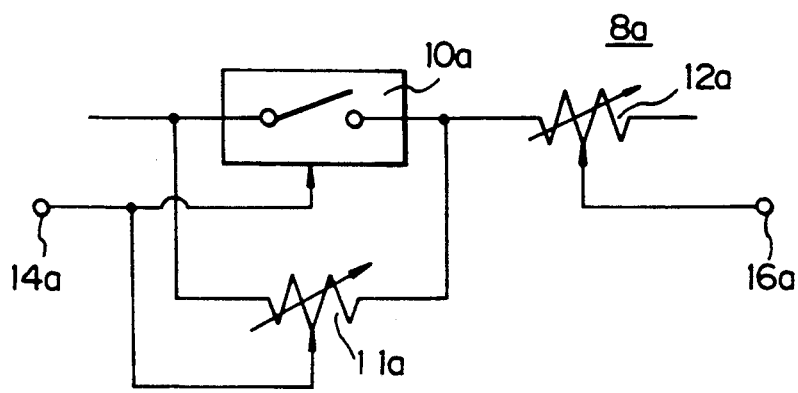
FIG. 2 is a diagram for explaining the principle of the voltage control amplifier used in the embodiment.

The channel 2a includes an aural signal input terminal 4a which can receive an aural signal from a microphone, and the aural signal from the microphone is fed through a level regulating variable resistor 6a to an aural signal transmitting means, such as, for example, a voltage control amplifier (VCA) 8a. Examples usable for the VCA 8a are μPC 1252H2 available from Nippon Denki Kabushiki Kaisha, Japan, 2150A, 2155, 2151 available from dbX Co., U.S., and so on. The principle of operation of the VCA 8a is diagrammatically illustrated in FIG. 2. A voice transfer switch 10a and an attenuating circuit 11a are connected in parallel to each other and a further attenuating circuit 12a is connected in series to the so-formed parallel circuit. When a control signal is provided to an on/off and attenuation control terminal 14a, the amount of attenuation of the attenuating circuit 11a is reduced in response to the magnitude of the control signal, and when the magnitude of the control signal becomes larger than a predetermined value, the voice transfer switch 10a is turned on. Further, when an attenuation control terminal 16a receives a second control signal, the amount of attenuation at the circuit 12a varies in response to the magnitude of the second control signal. FIG. 2 simply illustrates the principle, and actually a single attenuating circuit is controlled by the two control signals to provide the same function as that of the case having the voice transfer switch 10a and the attenuating circuits 11a and 12a. An output signal from the VCA 8a is supplied to an input of an amplifier 18 as a mixing means. An output signal from the VCA 8b of the channel 2b is also supplied to the input of the amplifier 18. An output signal from the amplifier 18 is fed through a level regulating variable resistor 20 and an amplifier 22 to an output terminal 24.

Turning again to the channel 2a, the aural signal from the variable resistor 6a is input to a band-pass filter (BPF) 26a as a noise eliminating filter means. The BPF 26a has a cut-off frequency so selected that low-frequency noise signals generated by a contact of a hand of a person who is speaking with the microphone and so on are eliminated from the input signal.

An output signal $S_a$ of the BPF 26a is amplified by an amplifier 28a, rectified by a full-wave rectifying circuit 30a and thereafter smoothed by a smoothing circuit 32a. Thus, an output signal of the smoothing circuit 32a designates the level, or magnitude of the aural signal from the microphone connected to the aural signal input terminal 4a. The full-wave rectifying circuit 30a and the smoothing circuit 32a serve as an aural signal level detecting circuit. The output signal of the smoothing circuit 32a is applied to one input terminal of a comparator 34a.

On the other hand, the output signal $S_a$ from the BPF 26a is also input to a combining circuit 36 provided outside of the channel 2a. Also fed to the mixing circuit 36 is the output signal $S_b$ from the BPF 26b of the channel 2b. The combining circuit 36 is constituted by an inverse adding amplifier so that an output signal of the combining circuit 36 is the inverted sum of the aural signals of the respective channels 2a and 2b representative $\overline{S_a + S_b}$ and fed to adders 38a and 38b of the respective channels 2a and 2b.

The output signal of the BPF 26a is also supplied to the adder 38a. Accordingly, an output signal from the adder 38a is represented as $\overline{S_b}$ which is the inversion of the aural signal $S_b$ of the channel 2b. The output signal from the adder 38a is amplified by an amplifier 40a, rectified by a full-wave rectifying circuit 42a and then smoothed by a smoothing circuit 44a. Thus, an output signal from the smoothing circuit 44a designates the level of the aural signal of the channel 2b. The amplification level of the amplifier 40a is set about 20 dB lower than that of the amplifier 28a.

The output signal of the smoothing circuit 44a is fed to an adder 46a. The adder 46a also receives noise threshold signal set by a variable resistor 48a at a level somewhat higher than the actual noise level and the output signal from the smoothing circuit 32a through an electronic switch 50a, the operation of which will be described below. An output signal from the adder 46a is provided as a reference signal to the comparator 34a.

The comparator 34a has a hysteresis property and generates an output signal of H-level when the level of the output signal of the smoothing circuit 32a is higher than the level $Th_1$ of the reference signal a from the adder 46a, as seen in FIGS. 4(b) and 4(c), and also generates an output signal of L-level when it is lower than an off-level $Th_2$ set somewhat lower than the reference signal level $Th_1$ by diode 35a and resistors 37a and 39a connected with the comparator 34a.

The output signal of the comparator 34a is fed as a control signal to an electronic switch 52a, connected in parallel to the BPF 26a for bypassing it. The electronic switch 52a is closed when the output signal of the comparator 34a is at the H-level.

The output signal of the comparator 34a is also provided to an adder 53a, to which is also provided an output signal from a sub-controller 55a for amplifying the output signal from the full-wave rectifying circuit 30a. An output signal from the adder 53a is supplied to the on/off and attenuation control terminal 14a (in FIG. 2) of the VCA 8a. The sub-controller 55a is constituted of a high gain amplifier having an amplification degree of 60 dB, for example, thereby generating an output signal in proportion to the input signal level thereof until the latter attains a predetermined value and holds the output signal at a predetermined value when the input signal exceeds the predetermined level. When the predetermined level of the output signal from the sub-controller 55a is supplied to the on/off and attenuation control terminal 14a of the VCA 8a, the voice transfer switch 10a (in FIG. 2) turns on and the attenuation of the attenuating circuit 11a (in FIG. 2) becomes substantially zero, while until the output signal of the sub-controller 55a is saturated at the predetermined value, the attentuation of the attenuating circuit 11a is controlled in accordance with the level of the output signal.

The output signal from the comparator 34a is also provided through an inverter 54a to an electronic switch 58a of a control voltage generating circuit 56. The electronic switch 58a closes to feed a constant voltage to an inverting amplifier 60 of the control voltage generating circuit 56 when an L-level signal is received from the inverter 54a. Similarly, the output signal of the comparator 34b of the channel 2b is also supplied through an inverter 54b to an electronic switch 58b of the control voltage generating circuit 56, the switch 58b feeds the constant voltage to the inverting amplifier 60 when the output signal from the inverter 54b is low. Thus, if the comparator of one of the channels, the comparator 34a, for example, generates an H-level output signal, this H-level output signal will be inverted by the inverter 54a and provided to the electronic switch 58a so that the switch 58a is closed and the constant voltage is amplified by the inverting amplifier 60. If both the comparators 34a and 34b of the channels 2a and 2b generate the H-level output signals, both of the electronic switches 58a and 58b will be closed and the output signal of the inverting amplifier 60 will be twice as high as the voltage generated when only one of the comparators generates the H-level output signal. Such an output signal of the inverting amplifier 60 is amplified by a logarithmic amplifier (log amp.) 62 and thereafter provided through a level regulating variable resistor 64 to the attenuation control terminals 16a and 16b (in FIG. 2) of the VCAs 8a and 8b. The VCAs 8a and 8b are supplied from the logarithmic amplifier 62 with the control signal which functions in such a manner that the attenuation is 0 dB when at least one of the comparator 34a and 34b is generating the L-level output signal, and the attenuation is 3 dB when both of the comparators 34a and 34b are generating the H-level output signals.

The output signals from the smoothing circuits 32a and 32b of the respective channels are supplied to a maximum value detecting circuit 66 which includes comparators 70a and 70b and inverting amplifiers 74a and 74b. One of input terminals of each of the comparators 70a and 70b is connected to the output of each of the smoothing circuits 32a and 32b by way of a diode 68a or 68b, and the inverting amplifiers 74a and 74b are also connected to the outputs of the smoothing circuits 32a and 32b by way of diodes 72a and 72b, respectively. The cathodes of these diodes 72a and 72b are connected to each other and the outputs of the inverting amplifiers 74a and 74b are connected to the input terminals of the comparators 70a and 70b which are also connected to the outputs of the smoothing circuits 32a and 32b. The comparators 70a and 70b receive at their other input terminals with a constant reference signal. Since the cathodes of the diodes 72a and 72b are connected to each other, either one of the output signals of the smoothing circuits 32a and 32b having a higher level than that of the other, e.g., the output signal of the smoothing circuit 32a if it has a higher level than that of the output signal of the smoothing circuit 32b, is only provided to the inverting amplifiers 74a and 74b. Such an output signal of the smoothing circuit 32a is inverted by the inverting amplifiers 74a and 74b and then input to the respective comparators 70a and 70b. In this case, the input signal to the comparator 70a is the output signal of the smoothing circuit 32a plus the inverted output signal thereof. Accordingly, the input signal is equal to zero, and therefore the output signal of the comparator 70a is at the L-level. On the other hand, the input signal to the comparator 70b is obtained by summing the output signal from the smoothing circuit 32b and the signal through the diode 72a and the inverting amplifier 74b from the smoothing circuit 32a, or the signal obtained by inverting the output signal from the smoothing circuit 32a. Since the magnitude of the latter signal is larger than that of the former as assumed above, the output signal from the comparator 70b is negative, or L-level. Accordingly, if the reference constant signal for each of the comparators 70a and 70b is set at a slightly lower value than zero, the comparator 70a, which is receiving the output signal from the smoothing circuit 32a having the maximum value, outputs the L-level signal, while the output signal of the comparator 70b, which is receiving the output signal from the smoothing circuit 32b having no maximum value, is at the H-level.

The output signal from the comparator 70a is supplied through a diode 76a to the control terminal of the electronic switch 50a and this control terminal is also supplied through a diode 78a with the signal being obtained by inverting the output signal of the comparator 34a by the inverter 54a. The electronic switch 50b of the channel 2b is similarly fed through diodes 76b and 78b with the output signal of the comparator 70b of the maximum value detecting circuit 66 and with the signal obtained by inverting the output signal of the comparator 34b by the inverter 54b. The electronic switch 50a is arranged to be closed when the output signal of the inverter 54a is at the H-level (the output of the comparator 34a is at the L-level) and the output of the comparator 70a of the maximum value detecting circuit 66 is at the H-level. Similarly, the electronic switch 50b is arranged to be closed when the output signal of the inverter 54b is at the H-level (the output of the comparator 34b is at the L-level) and the output of the comparator 70b of the maximum value detecting circuit 66 is at the H-level. Namely, each of the electronic switches 50a and 50b is closed when the aural signal on the corresponding channel is lower than that of the other channel.

The operation of the automatic mixer apparatus will be described below with the sub-controllers 55a and 55b being out of operation. The operation of the sub-controllers 55a and 55b will subsequently be described. It is assumed that all the electronic switches 50a, 50b, 52a, 52b, 58a and 58b are open.

As shown in FIG. 3, in the initial period $T_1$ in which no aural signal is input from the microphones to either of the aural signal input terminals 4a and 4b, even if the microphones pick up noise, the noise is eliminated by the BPFs 26a and 26b and thus the outputs of the smoothing circuits 32a and 32b are both zero. The comparators 34a and 34b receive these zero signals from them in the period $T_1$. At this time, the output of the combining circuit 36 carrying out the operation of adding the output signals of the BPFs 26a and 26b is zero and thus the output signals of the adders 38a and 38b obtained by adding the output signals of the BPFs 26a and 26b thereto are zero. Accordingly, the output signals from the smoothing circuits 44a and 44b are also zero. Therefore, only the noise threshold signals set as reference signals by the variable resistors 48a and 48b are provided to the reference input terminals, or (−) input terminal of the comparators 34a and 34b, and thus the comparators 34a and 34b output the L-level signal to the on/off and attenuation control terminals 12a (in FIG. 2) of the VCAs 8a and 8b so that the respective voice switches 10a and 10b are maintained in their off-condition. Since both the output signals of the smoothing circuits 32a and 32b are zero, both of the comparators 70a and 70b of the maximum value detecting circuit 66 output the L-level signal. The output signals from the inverters 54a and 54b are held at the H-level in response to the L-level signals from the comparators 34a and 34b. Therefore, the electronic switches 50a and 50b are kept open. Since the output signals of the inverters 54a and 54b are at the H-level, the electronic switches 58a and 58b of the control voltage generating circuit 56 are also kept open and no control voltage is generated thereby.

In such a condition, when an aural signal is inputted to the aural signal input terminal 4a of the channel 2a, as shown in FIG. 3 at the second period $T_2$, it is rectified, smoothed and then input to the (+) input terminal of the comparator 34a. On the other hand, the combining circuit 36 produces a signal by inverting the aural signal of the channel 2a, and this signal is supplied to the adder 38a, where it is added to the aural signal of the channel 2a. Since the addition result is zero, the input signal through the circuits 40a, 42a and 44a to the adder 46a is zero. Thus, the noise threshold signal set at the variable resistor 48a is supplied as the reference signal to the comparator 34a. Since the output signal of the smoothing circuit 32a is higher than this reference signal, the output signal of the comparator 34a is at the H-level. Thus, the voice transfer switch 10a (in FIG. 2) of the VCA 8a turns on to transfer the aural signal of the channel 2a to the amplifier 18a. The electronic bypass switch 52a is closed by the output signal of the comparator 34a being at the H-level, and the noise generated by gripping the microphone in addition to the aural signal is also rectified, smoothed and fed to the comparator 34a. Accordingly, the level of the signal input to the comparator 34a is raised to enable the comparator 34a to be kept at the H-level.

The signal inverted from the aural signal of the channel 2a is fed from the combining circuit 36 to the adder 38b, in which it is added with the zero aural signal of the channel 2b. The resultant signal is rectified, smoothed and supplied to the adder 46b, and thus the comparator 34b receives the aural signal of the channel 2a added with the noise threshold signal set by the variable resistor 48b as the reference signal. Consequently, the output signal of the comparator 34b is maintained at the L-level and the voice transfer switch 10b of the VCA 8b is held open.

At this time, since the aural signal is only in the channel 2a, the comparator 70b of the maximum value detecting circuit 66 is at the H-level, and since the comparator 34b is at the L-level, the output of the inverter 54b is at the H-level. The electronic switch 50b is therefore closed and the noise threshold reference signal from the variable resistor 48b is added with the signal from the smoothing circuit 32b. Thus, the comparator 34b does not invert its output to the H-level.

At this time, since the output signal from the comparator 34a is at the H-level, the electronic switch 58a of the control voltage generating circuit 56 is closed so that the predetermined control voltage is output from the control voltage generating circuit 56. This control voltage is amplified by the logarithmic amplifier 62 and then fed to the attenuation control terminals 16a (in FIG. 2) and 16b of the VCAs 8a and 8b, but in this condition the attenuation is held at 0 dB.

In this condition, even if an aural signal is inputted to the aural signal input terminal 4b of the channel 2b and its level is lower than that of the aural signal of the channel 2a, the output signal of the comparator 70a of the maximum value detecting circuit 66 is maintained in the L-level condition and the output of the comparator 70b also in the H-level condition, thereby no change is caused in the condition in which only the aural signal of the channel 2a is transmitted, as described above.

On the other hand, when the level of the aural signal of the channel 2b is higher than that of the aural signal of the channel 2a, the comparator 70a of the maximum value detecting circuit 66 outputs the H-level signal and the comparator 70b outputs the L-level signal, as seen in FIG. 3 at the third period T$_3$. Since the output signal from the comparator 70b is at the L-level and the output of the inverter 54b is at the H-level (the output of the comparator 34b is at the L-level), the electronic switch 50b is relieved and the condition in which the aural signal level of the channel 2b is supplied to the comparator 34b as a part of the reference signal is also relieved.

As the result, the output signal from the smoothing circuit 44b plus the noise threshold signal set at the variable resistor 48b are fed as the reference signal. The output signal from the smoothing circuit 44b is equal to the output signal from the combining circuit 36 (inverted sum of the aural signals of the channels 2a and 2b) plus the aural signal of the channel 2b, and therefore corresponds to the rectified, smoothed aural signal of the channel 2a. Accordingly, the output signal from the comparator 34b is at the H-level and thus the voice switch 10b of the VCA 8b is turned on to transfer the aural signal of the channel 2b to the amplifier 18. The electronic bypass switch 52b is also closed and the aural signal including the noise signals is rectified, smoothed and supplied to the comparator 34b as a part of the reference signal.

The reference signal for the comparator 34a of the channel 2a is the aural signal including the noise signals of the channel 2b plus the noise threshold signal set by the variable resistor 48a. Since the gain of the amplifier 40a is 20 dB lower than that of the amplifier 28a, the output from the smoothing circuit 32a is higher than the reference signal for the comparator 34a thereby maintain the output thereof at the H-level, as long as the aural signal of the channel 2b does not become 20 dB higher than that of the channel 2a. Thus, the aural signal of the channel 2a is also fed to the amplifier 18.

Since the outputs of the comparators 34a and 34b are both at the H-level, the electronic switches 58a and 58b of the control voltage generating circuit 56 are both closed to increase the control voltage generated by the control voltage generating circuit 56 in comparison with the period T$_2$. Such an increased control voltage is supplied through the logarithmic amplifier 62 to the attenuation control terminals 16a and 16b of both of the VCAs 8a and 8b and consequently the attenuation amounts of the attenuating circuits 12a and 12b of the VCAs 8a and 8b are set at 3 dB, so that the aural signals attenuated by 3 dB are supplied from the channels 2a and 2b to the amplifier 18 to provide a maximum gain within a range which does not cause howling.

In this condition, when the aural signal from the input terminal 4a of the channel 2a is interrupted at the fourth period T$_4$, the output from the comparator 34a is turned to the L-level, the voice switch 10a of the VCA 8a and the electronic switch 52a are opened, while the electronic switch 50a is closed, thereby the transmission of the aural signal from the channel 2a is interrupted, and the output signal of the comparator 34a is turned to the L-level. Further, the electronic switch 58a is also opened to reduce, the voltage generated by the control voltage circuit 56, and thus the attenuation of the VCA 8b becomes 0 dB.

The function of the sub-controllers 55a and 55b will now be described using FIGS. 4(a)–4(e). When an aural signal as illustrated in FIG. 4(a) is input, the envelope will be as shown in FIG. 4(b). Since the reference signal supplied to the comparator 34a or 34b has the voltage level Th$_1$ and the off-level due to the hysteresis of the comparator is the Th$_2$, the output signal of the comparator 34a or 34b is as shown in FIG. 4(c). If this output signal in the shown condition is supplied to the on/off and attenuation control terminal 14a or 14b (in FIG. 2) of the VCA 8a or 8b, the hatched portions of the aural signal shown in FIG. 4(b) will be cut off and thus the initial, intermediate and terminal portions of the speech will be eliminated to make the produced speech unnatural. To deal with this problem, in the present embodiment, the output signals of the sub-controllers 55a and 55b are added by the adders 53a and 53b to the output signals of the comparators 34a and 34b respectively and the resultant signals are provided to the on/off and attenuation control terminals 12a and 12b. The sub-controller 55a or 55b enhances its output signal in proportion to the envelope of the output signal from the full-wave rectifying circuit 30a or 30b until the output signal from the full-wave rectifying circuit 30a or 30b is raised to a certain level, as shown in FIG. 4(d), and thereafter kept to output a constant level. When the output signal from the rectifying circuit is lowered under the certain level, the sub-controller outputs the signal in proportion to the envelope of the output signal from the rectifying circuit. This level is preferably set at a constant value near to the level $Th_1$. Even if the level is higher than the level $Th_1$, the electronic switch 52a or 52b is closed to enhance the output signal level of the rectifying circuit 30a or 30b when the output signal of the comparator 34a or 34b is turned to the H-level, and therefore the sub-controller 55a or 55b will output the constant level substantially at the same time when the output of the comparator is turned to the H-level. In this manner, the output signal of the sub-controller 55a or 55b is in proportion to the magnitude of the aural signal until the magnitude of the aural signal attains the reference signal, or the level $Th_1$, and thereafter it is held at the constant level. Since the output signal of the sub-controller 55a or 55b as well as the output signal of the comparator 34a or 34b is supplied to the on/off and attenuation control terminal 12a or 12b of the VCA, the attenuation of the attenuating circuit 11a (in FIG. 2) lowers until the output of the sub-controller 55a or 55b attain a constant value, and after the output signal of the sub-controller 55a or 55b become lower than the constant value the attenuation increases in response thereto. Accordingly, even when the output signal of the comparator 34a or 34b is at the L-level, there is no abrupt interruption of the aural signal in the VCA 8a or 8b and no elimination of the initial, intermediate and terminal portions of the speech, as shown in FIG. 4(e).

In the above-described embodiment for simplicity, there are dully provided two channels but a further number of channels can optionally be provided in response to the circumstances. In such a case, if there is a n-number of the VCAs in their on-state, it will be necessary to set the attenuation in each of the VCAs at 10 log n (dB). As the aural signals of the respective channels in on-state are provided to the combining circuit 36, the circuit 36 generates a signal of the total amount of the aural signals of the channels, and thus each of the adders corresponding to the adders 46a and 46b, of the respective channels receives signals in proportion to the total amount of levels of the other channel's aural signals. Although the above-described embodiment is arranged to regulate the attenuation of the VCAs 8a and 8b, it is possible, for example, to regulate the gain of the amplifiers 18 and/or 22. Although the VCAs 8a and 8b are controlled to regulate the attenuation, it is further possible to provide amplifying means in the VCAs and control the gain of such amplifying means. Furthermore, low-pass filters may be used instead of the BPFs used in the above-described embodiment. In the above-described embodiment, the comparators 34a and 34b have a hysteresis characteristic, but they may have no such characteristic according to requirements.

In the above-described embodiment, the gain control for the VCAs 8a and 8b is equally performed by the common signal from the control voltage circuit 56 through the logarithmic amplifier 62 and level regulating variable resistor 64, but the channels 2a and 2b may separately be controlled. In such an instance, the control signal for each of the individual channels can be produced by combining the signals derived from each of the comparators 34a and 34b, the combining circuit 36, the maximum value detecting circuit 66 and so on. With the separate gain control for the individual channels 2a and 2b, the apparatus can accommodate various system specifications and requirements. For example, if the apparatus is used for a conference room system, the apparatus can be arranged so that the unit, or channel for the chairman has priority, and a unit for a member with a tendency to speak in a low or loud voice is set to have a higher or lower level of amplification. In comparison with the conventional system which equally performs gain control using a voltage control amplifier provided at the final stage of the system, the system with the separate gain control arrangement described above provides for flexibility in arrangement or design of a system.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. An automatic mixer apparatus comprising:
  a plurality of input terminals for receiving respective aural signals;
  a plurality of channels connected to said respective input terminals, each of said channels including first detecting means for detecting a level of said respective one aural signal input to the corresponding input terminal and to produce a detected signal level, first comparator means for comparing said detected signal level from said first detecting means with a level of a reference signal and outputting a comparison signal when the detected signal level is higher than the reference signal level, and gain controllable transfer gate means for selectively transferring said aural signal in response to said comparison signal from said first comparator means;
  gain control means connected to receive said comparison signals from said first comparator means of said channels for controlling the gains of said transfer gate means of said channels in accordance with the number of received comparison signals, said gain control means comprising a variable voltage generator for generating a voltage variable in accordance with the number of said comparison signals, and a log-amplifier for log-amplifying said voltage from said generator and outputting gain control signals to said transfer gate means of said channels;
  mixing means for mixing signals from said transfer gate means of said channels; and
  an output terminal for outputting the mixed signal from said mixing means.

2. An apparatus according to claim 1 further comprising combining means for combining said aural signals of the channels to produce a combined signal, inverting the combined signal and outputting an inverted combined signal to each of said channels, wherein each of said channels further comprises:

first summing means for summing the aural signal of one of said channels and said inverted combined signal from said combining means to produce a summed signal;

second detecting means for detecting the level of the summed signal from said first summing means and outputting a second detected signal; and second summing means for adding the second detected signal from said second detecting means to said reference signal.

3. An apparatus according to claim 1 further comprising a sub-control means which comprises amplifier means for amplifying said signal level output from said first detecting means until said signal level exceeds a predetermined level near to said reference signal level.

4. An apparatus according to claim 1, wherein each of said channels further comprises filter means incorporated prior to said first and second detecting means for eliminating noise factor combined in an input aural signal and bypass switching means connected in parallel with said filter means for transmitting said input aural signal including said noise factor to said first and second detecting means in response to said comparison signal from said first comparator means.

5. An apparatus according to claim 2, wherein each of said channels further comprises switching means for transferring said detected signal level from said first detecting means to said second summing means to add said detected signal level to said reference signal.

* * * * *